United States Patent
Bolotin et al.

(10) Patent No.: US 9,977,939 B2
(45) Date of Patent: *May 22, 2018

(54) PROGRAMMING AND PLACEMENT TECHNIQUES FOR RFID TAGS WITHOUT ANTENNAS

(71) Applicant: III HOLDINGS 1, LLC, Wilmington, DE (US)

(72) Inventors: Lev M. Bolotin, Kirkland, WA (US); Simon B. Johnson, Bonney Lake, WA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/244,448

(22) Filed: Aug. 23, 2016

(65) Prior Publication Data
US 2016/0357998 A1 Dec. 8, 2016

Related U.S. Application Data

(63) Continuation of application No. 14/746,343, filed on Jun. 22, 2015, now Pat. No. 9,424,452, which is a (Continued)

(51) Int. Cl.
*G08B 21/00* (2006.01)
*G06K 7/10* (2006.01)
(Continued)

(52) U.S. Cl.
CPC ........ *G06K 7/10415* (2013.01); *B25J 9/0093* (2013.01); *B25J 9/1694* (2013.01);
(Continued)

(58) Field of Classification Search
CPC ........ G06K 7/10415; G06K 19/07749; G06K 17/0025; B65C 2009/0003
See application file for complete search history.

(56) References Cited

U.S. PATENT DOCUMENTS 4,830,692 A 5/1989 Art
5,574,470 A * 11/1996 de Vall ............... G06K 7/10336
340/572.7
(Continued)

FOREIGN PATENT DOCUMENTS

FR 2850832 A1 8/2004
JP 2002-157008 5/2002
(Continued)

OTHER PUBLICATIONS

Search Report for Taiwanese Patent Application No. 095134179.

*Primary Examiner* — Mark Rushing
(74) *Attorney, Agent, or Firm* — McAndrews, Held & Malloy, Ltd.

(57) ABSTRACT

A radio frequency identification system, and method of operation thereof, provides: a sensor for sensing the absence or presence of a radio frequency identification transponder at the radio frequency identification system; a supply system connected to the sensor for supplying the radio frequency identification transponder to the radio frequency identification system in the absence of the radio frequency identification transponder at the radio frequency identification system; and a programmer connected to the sensor for writing transponder content to the radio frequency identification transponder at the radio frequency identification system in the presence of the radio frequency identification transponder at the radio frequency identification system.

20 Claims, 4 Drawing Sheets

Related U.S. Application Data continuation of application No. 13/440,635, filed on Apr. 5, 2012, now abandoned, which is a continuation of application No. 12/067,046, filed as application No. PCT/US2006/036239 on Sep. 15, 2006, now Pat. No. 8,179,259.

(60) Provisional application No. 60/596,338, filed on Sep. 16, 2005.

(51) Int. Cl.
*G06K 19/077* (2006.01)
*G06K 19/08* (2006.01)
*H05K 1/02* (2006.01)
*H05K 1/16* (2006.01)
*H05K 13/04* (2006.01)
*H05K 13/08* (2006.01)
*B25J 9/00* (2006.01)
*B25J 9/16* (2006.01)
*G06K 15/02* (2006.01)
*B65C 9/00* (2006.01)

(52) U.S. Cl.
CPC ....... *G06K 7/10366* (2013.01); *G06K 15/021* (2013.01); *G06K 19/07749* (2013.01); *G06K 19/08* (2013.01); *H05K 1/0266* (2013.01); *H05K 1/16* (2013.01); *H05K 13/0417* (2013.01); *H05K 13/08* (2013.01); *B65C 2009/0003* (2013.01); *H05K 2201/10098* (2013.01); *Y10S 901/07* (2013.01); *Y10T 29/53187* (2015.01)

(56) References Cited

U.S. PATENT DOCUMENTS

| | | | |
|---|---|---|---|
| 6,104,291 | A | 8/2000 | Beauvillier |
| 6,327,972 | B2 | 12/2001 | Heredia |
| 6,899,476 | B1 | 5/2005 | Barrus |
| 7,616,094 | B2 | 11/2009 | Heinrich |
| 2003/0121607 | A1 | 7/2003 | Davis |
| 2003/0233749 | A1 | 12/2003 | Bolotin |
| 2004/0215350 | A1* | 10/2004 | Roesner ........... G06K 19/07718 700/1 |
| 2005/0167024 | A1 | 8/2005 | Sanzone |
| 2006/0109496 | A1 | 5/2006 | Brown |

FOREIGN PATENT DOCUMENTS

| | | |
|---|---|---|
| WO | 2000-021032 A1 | 4/2000 |
| WO | 2005-047115 A1 | 5/2005 |

* cited by examiner

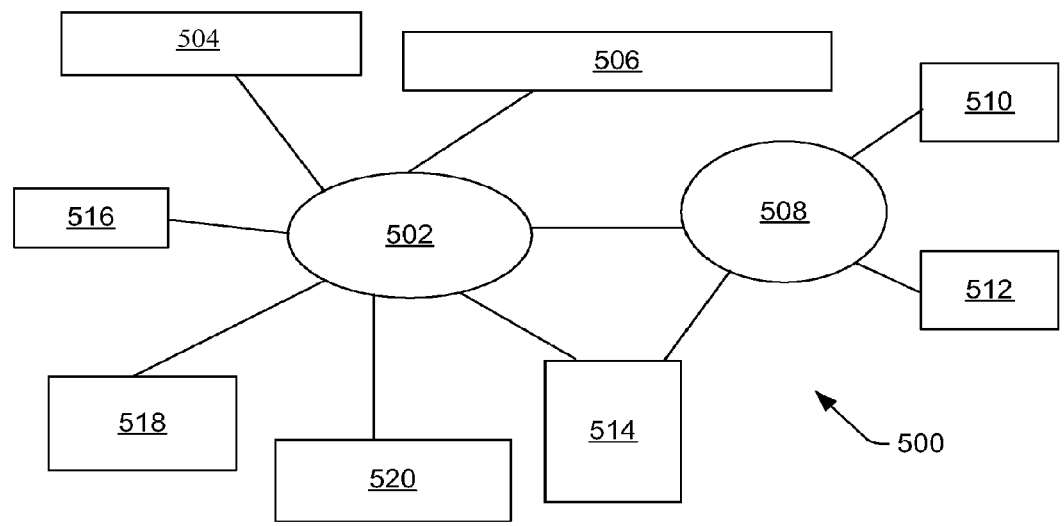
FIG. 5
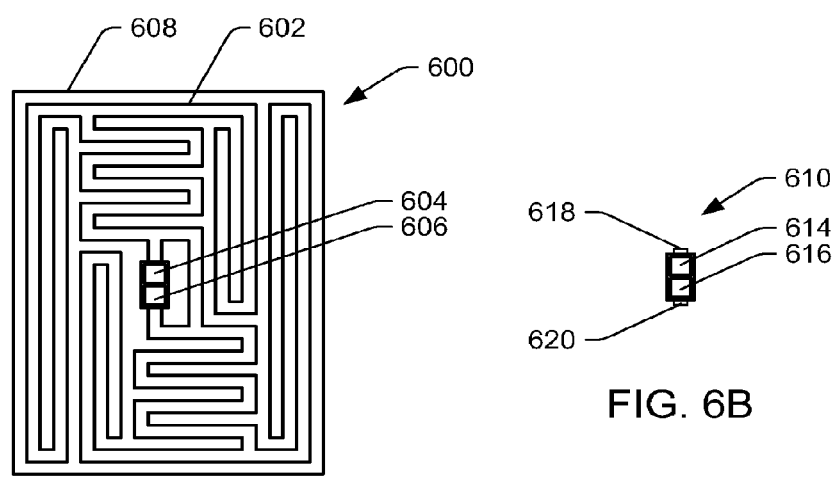
FIG. 6A
FIG. 6B

PROGRAMMING AND PLACEMENT TECHNIQUES FOR RFID TAGS WITHOUT ANTENNAS

This application is a continuation of U.S. application Ser. No. 14/746,343 filed Jun. 22, 2015, which is a continuation of U.S. application Ser. No. 13/440,635 filed Apr. 5, 2012, which is a continuation of U.S. application Ser. No. 12/067, 046, filed Mar. 15, 2008, and issued as U.S. Pat. No. 8,179,259, which claims the benefit of PCT Application No. PCT/US2006/036239, filed Sep. 15, 2006, and the subject mutters thereof are hereby incorporated herein by reference thereto.

This application claims the benefit of U.S. Provisional Patent Application Ser. No. 60/596,338 filed on Sep. 16, 2005, and the subject mailer thereof is hereby incorporated by reference thereon.

TECHNICAL FIELD

The present invention relates generally to radio frequency identification (RFID) systems, and more particularly to high volume application RFID systems.

BACKGROUND ART

Currently, various products are tracked through the use of barcodes which are identification labels having a series of different width vertical stripes, which are capable of being scanned using hand scanners to provide computer readable numerical codes. Generally, the scanner must be within a specific close distance and in a specific relationship to rite barcodes to be able to read them. Barcodes are used on products as diverse as electronic equipment, clothing, and produce.

As technology evolved, small electronic circuits have been developed that are capable of sending and receiving radio signals, which may be used to identify different products. These circuits are called RFID circuits, or radio frequency identification circuits.

In one application, barcode labels (and labels with unique part numbers) are applied to circuit boards during the manufacturing process for the purpose of tracking inventory and configuration control. Such labels are mostly "pre-printed" and currently applied manually or by dedicated label applicator machines. Label sizes are getting smaller and barcodes are becoming obsolete. There has been a desire to replace barcodes with RFID circuits and some experimental ion has been carried out in this area.

Currently, labels with embedded RFID circuits that can be "written" to with unique ID information are starting to be introduced. RFID primers (that include readers/writers) are becoming available that allow a customer to print/read write an RFID label and apply the printed RFID label manually or "off-line" to a product. This approach is acceptable in low production environments where quality/consistency requirements are not high.

Currently also, there are manufacturing environments where high production and quality/consistency requirements are very high. In these environments, assemblies (especially, electronic printed circuit board (PCB) assemblies) must be built in huge quantities and many different configurations.

In addition to the many different configurations, high quality oriented processes require unique hardware and software tracking methods/mechanisms for each and every assembly for the purpose of the configuration control and inventory tracking. A unique ID number is encoded in a barcode and printed on a label that needs to be affixed to the assembly.

With the huge number of electronic and other assemblies produced, there is a need to simplify this process, which until now has been essentially a manual process.

One approach has been to integrate mechanized manual equipment into a distinct assembly cell (as a part of the automated production line) with a dedicated function: print and apply the printed/written labels (using label applicator(s)).

Unfortunately, this approach consumes valuable production floor space.

Also, from uptime and reliability points of view, if the dedicated assembly cell goes down, it takes down the whole assembly line. A manufacturer cannot easily "replace" the whole assembly cell within minutes and replacement could result in substantial and expensive downtime.

Solutions to these problems have been long sought but prior developments have not taught or suggested any solutions and, thus, solutions to these problems have long eluded those skilled in the art.

DISCLOSURE OF THE INVENTION

The present invention provides a method of operation of a radio frequency identification system that includes: providing a radio frequency identification transponder; sensing the absence or presence of the radio frequency identification transponder at the radio frequency identification system; supplying the radio frequency identification transponder to the radio frequency identification system in the absence of the radio frequency identification transponder at the radio frequency identification system; and writing transponder content to the radio frequency identification transponder at the radio frequency identification system in the presence of the radio frequency identification transponder at the radio frequency identification system.

The present invention provides a radio frequency identification system that includes: a sensor for sensing the absence or presence of a radio frequency identification transponder at the radio frequency identification system; a supply system connected to the sensor for supplying the radio frequency identification transponder to the radio frequency identification system in the absence of the radio frequency identification transponder at the radio frequency identification system; and a programmer connected to the sensor for writing transponder content to the radio frequency identification transponder at the radio frequency identification system in the presence of the radio frequency identification transponder at the radio frequency identification system.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 5 a schematic diagram of the internal circuit architecture of a RFID system;

FIGS. 6A and 6B are plan views of RFID tags in accordance with embodiments of the present invention;

BEST MODE(S) FOR CARRYING OUT THE INVENTION

Figure 1:
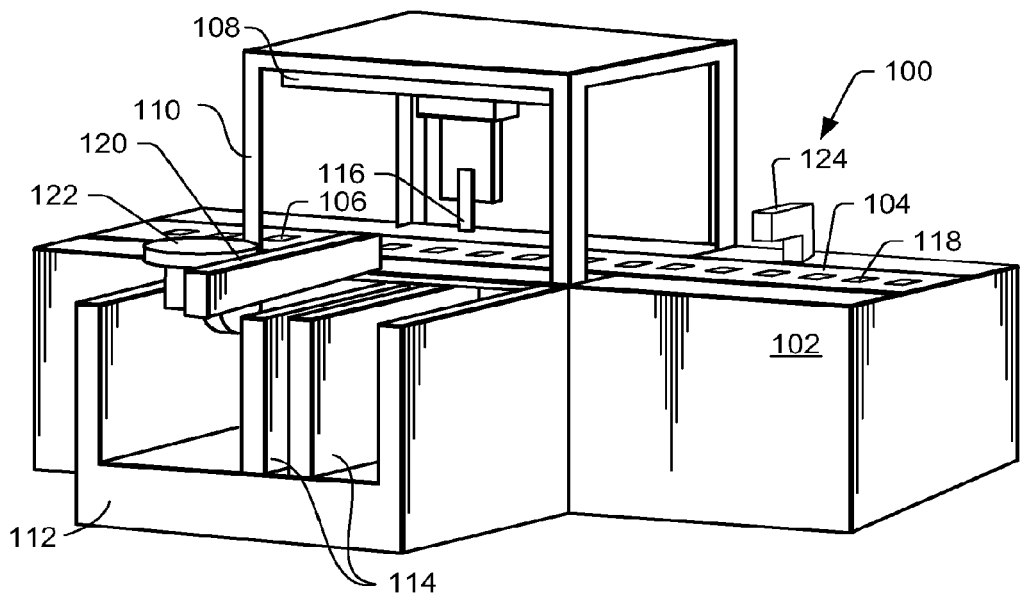
FIG. 1 is an isometric view of an assembly line in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention. The numbering of the embodiments as first, second, etc. is merely for convenience in description.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs.

For purposes of the present invention, a "feeder" means any electromechanical (or pneumatic, or "pure" mechanical") device that supplies components to a pick and place robot for assembling circuit boards. The term "system" is used to describe both the RFID apparatus and method, and the context determines which of the two is being described.

Most PCB (printed circuit board) components are delivered to the customer in tape (sometimes in trays, tubes, or bulk). A tape feeder removes the cover tape from the packaging carrier tape to expose each component within a tape pocket in the packaging tape. The component is positioned so that an assembly machine robotic Pick-and-Place (PNP) mechanism can pick it up and place it on a PCB. Once a component is picked up from a pocket, the feeder advances the tape to expose the next component. Most of the components are capacitors, resistors, ICs, micro-controllers etc.

Referring now to FIG. 1, therein is shown an isometric view of an assembly line 100 in accordance with an embodiment of the present invention. The assembly line 100 includes a platform 102 supporting a conveyor belt 104 for conveying printed circuit boards (PCBs) 106.

The conveyor belt 104 moves the PCBs 106, which may be unpopulated or partially populated with components, past a robotic handling system 108 mounted on a support frame 110 over the conveyor belt 104.

A feeder table 112 is attached to the platform 102 to support a number of input feeders 114. The input feeders 114 provide electronic components in line to the robotic handling system 108. The input feeders 114, exemplarily, may be tape feeders. The robotic handling system 108 moves a PNP head 116 along an X-Y-Z and θ coordinate system (with X and Y being horizontal movements, Z being vertical, and θ being rotational) to take components from the input feeders 114 and place them on the PCBs 106 to form populated or filled PCBs 118.

Adjacent to the input feeders 114 is an RFID system 120 in accordance with a first or second embodiment of the present invention and an RFID system 122 in accordance with a third embodiment of the present invention. The RFID system 120 also includes an assembly line RFID reader/writer 124 (optional) connected to the assembly line 100 for reading and/or writing RFID tags (described hereinafter) during various processing steps. The RFID systems 120 and 122 are generally connected to the feeder table 112 to feed RFID tags in a first direction perpendicular to a second direction in which the conveyor belt 104 of the assembly line 100 moves as shown in FIG. 1.

Figure 2:
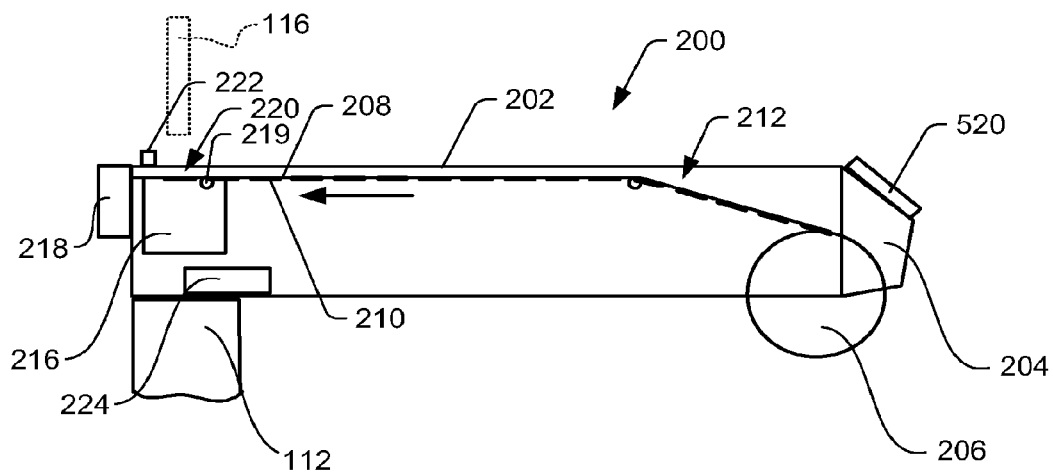
FIG. 2 is a schematic diagram of an RFID system in accordance with a first embodiment of the present invention.

Referring now to FIG. 2, therein is shown a schematic diagram of a cross-sectional view of an RFID system 200 in accordance with a first embodiment of the present invention. The RFID system 200 may be described as an automated in-line RFID supply/reader/writer/feeder because the supply, reader, writer, and feeder are sequentially in line along a first axis as shown in FIG. 2. As shown in FIG. 1, the assembly line 100 moves products such as the PCBs 106 on the conveyor belt 104 along a second axis perpendicular to the axis of the RFID system 200.

The RFID system 200 includes a frame 202 carrying a control system 204, shown in more detail in FIG. 5, for controlling operations and for reading and writing (programming) an RFID tag containing a transponder and an exemplary antenna as shown in FIG. 6A and described hereinafter. The frame 202 is connected to the feeder table 112 of FIG. 1.

A RFID tag supply system 206 supported by the frame 202 supplies a continuous tape 212 of labels 208 with each label 208 having a RFID tag 210. The labels 208 can be pre-printed or blank in which case a printer (optional, not shown on FIG. 2; shown as optional 314 on FIG. 3) would be used to print the blank labels. The RFID tag supply system 206 may be any type of media feeder in addition to the continuous tape 212, such as bulk feeders, tubes, trays, tray stackers, etc.

A RFID reader/writer 216 is mounted on the frame 202 adjacent to the tape to read and/or write the RFID tag 210. The RFID reader/writer 216 is generically referred to as a RFID programmer and is capable of reading, writing, or reading and writing to RFID lags.

In one embodiment, the RFID tag 210 has an integral antenna and it has been discovered that it is possible to wirelessly read and/or write the RFID tag 210 without contact, which eliminates a source of wear on the RFID system 200. It is even possible to read and write the RFID tag 210 without removing it from the label 208. This allows a rejected RFID tag to remain on a label going into a wastebasket or cutter mechanism 218 (usually mounted on the feeder table 112 or assembly machine).

The labels 208 and the RFID tag 210 are separated from the tape 212 of labels 208 and are fed to a pick-up point 220 for pick up by the PNP head 116 of the robotic handling system 108 of FIG. 1. The labels 208 can have a heat setting adhesive on the bottom or the pick-up point 220 optionally has a non-stick surface to allow adhesive to be placed on the back of the RFID tag 210 so it may be placed on the PCB 106 to be held by a backing adhesive on the RFID tag 210. A sensor 222 is positioned adjacent the pick-up point 220 for sensing the presence of the label 208 or the RFID tag 210 and its removal by the PNP head 116.

The RFID system 200 is considered an "in-line" system because the RFID tag supply system 206, the tape 212 of labels 208, the RFID reader/writer 216, and the pick-up point 220 are all directly in line. It also works as an inline RFID feeder system as a part of the assembly line.

In operation, the RFID system 200 is positioned on the feeder table 112 of the assembly line 100 of FIG. 1. The RFID system 200 may optionally be connected to the computer controlling the assembly line 100. The tape 212 is wound around various feed rollers (some of them not shown).

The RFID reader/writer 216 reads the RFID tag 210 to make sure that the RFID tag 210 is not defective, writing to put the correct information on the RFID tag 210, or correcting any incorrect information on the RFID tag 210 to assure that the information on the label 208 corresponds to the information in the transponder of the RFID tag 210. The RFID tag 210 is then fed by a feeder 219 to the pick-up point 220.

Figure 3:
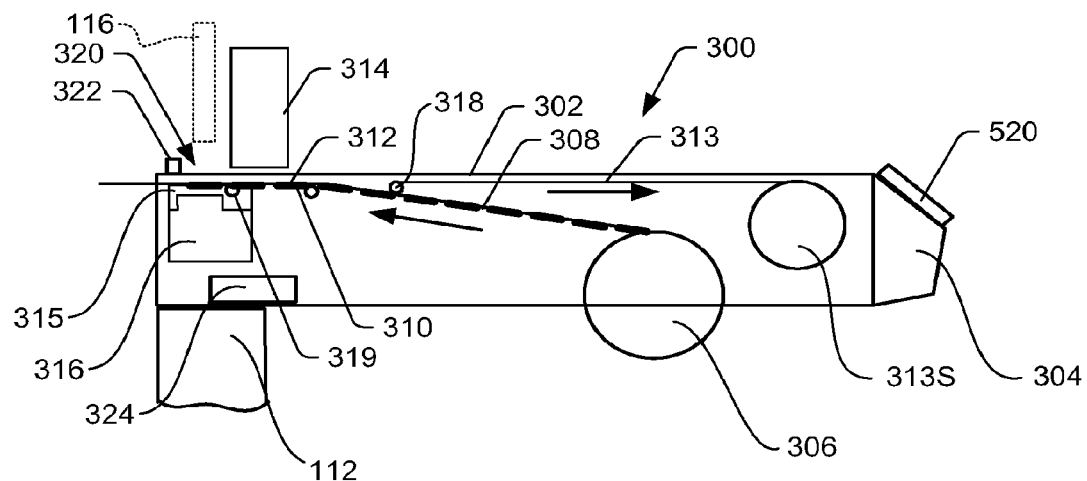
FIG. 3 is a schematic diagram of an RFID system in accordance with a second embodiment of the present invention.

Referring now to FIG. 3, therein is shown a schematic diagram of a cross-sectional view of an RFID system 300 in accordance with a first embodiment of the present invention. The RFID system 300 may be described as an automated in-line RFID supply/reader/writer/label printer/feeder. Please note that printer could be optional here as well.

The RFID system 300 includes a frame 302 carrying a control system 304, shown in more detail in FIG. 5, for controlling operations and for reading and writing a "bare" RFID tag containing a transponder without an antenna as shown in FIG. 6B and described hereinafter. The frame 302 is connected to the feeder table 112.

An RFID tag supply system 306 supported by the frame 302 supplies a carrier tape 308 having pockets with each pocket containing a RFID tag 310.

The RFID tags 310 may come provided with labels 312 or optionally a label feeder system (not shown) may supply the labels A printer (optional) 314, which may be a thermal, inkjet, dot-marker, or other printer, is mounted on the frame 302 adjacent to the tape 308 to print on the labels 312.

A RFID reader/writer 316 is mounted on the frame 302 adjacent to the tape to read and/or write the RFID tag 310.

It has been discovered that it is also possible to make the RFID tag 310 without an antenna, which makes the RFID tag 310 much less expensive and much smaller since the antenna is usually one of the more expensive parts of an RFID tag and often the largest. In such an embodiment, the reading and writing may be performed by direct contact by the RFID reader/writer 316 with contacts provided on the RFID tag 310. In another such embodiment, an antenna 315 on the radio frequency (RF) reader/writer 316 contacts the contacts provided on the RFID tag 310.

Where the RFID tag 310 is without an antenna, the PCB 106 of FIG. 1 will be provided with an antenna, which will connect with the contacts provided on the RFID tag 310. Antennas may be easily added to PCBs or made on PCBs when making the electrical traces on the PCBs. The reflow soldering process used to solder components on the PCB 106 will also connect the RFID tag 310 to the antenna on the PCB 106.

A cover tape 313 over the pockets containing the RFID tags 310 is peeled and directed by a peel bar 318 and goes back in the opposite direction and collected by a cover tape spool 313S (optional) or a cover tape dispenser (optional, not shown). The RFID tag 310 then is fed by a feeder 319 to a pick-up point 320 for pick up by the PNP head 116 of the robotic handling system 108 of FIG. 1. The pick-up point 320 optionally has a non-stick surface to allow adhesive to be placed on the back of the RFID tag 310 so it may be placed on the PCB 106 to be held by a backing adhesive on the RFID tag 310.

A sensor 322 is positioned adjacent the pick-up point 320 for sensing the presence of the RFID tag 310 and its removal by the PNP head 116 of FIG. 1.

Defective RFID lags are fed to a defect bin 324 or just come out with the empty tape 308 out of the feeder into a wastebasket.

The RFID system 300 is considered an "in-line" system because the RFID tag supply system 306, the tape 308, the printer 314, the RFID reader/writer 316, and the pick-up point 320 are all directly in line.

In operation, the RFID system 300 is positioned on the feeder table 112 of the assembly line 100 of FIG. 1. The RFID system 300 may optionally be connected to the computer controlling the assembly line 100. The tape 308 is wound around various feed rollers.

The printer 314 prints text, part numbers, etc. on the labels 312 and the RFID tag 310 is fed to the RFID reader/writer 316.

The RFID reader/writer 316 reads the RFID tag 310 to make sure that the RFID tag 310 is not defective, writes to put the correct information on the RFID tag 310, or corrects any incorrect information on the RFID tag 310 to assure that the information on the label 312 corresponds to the information in the transponder of the RFID tag 310.

Figure 4:
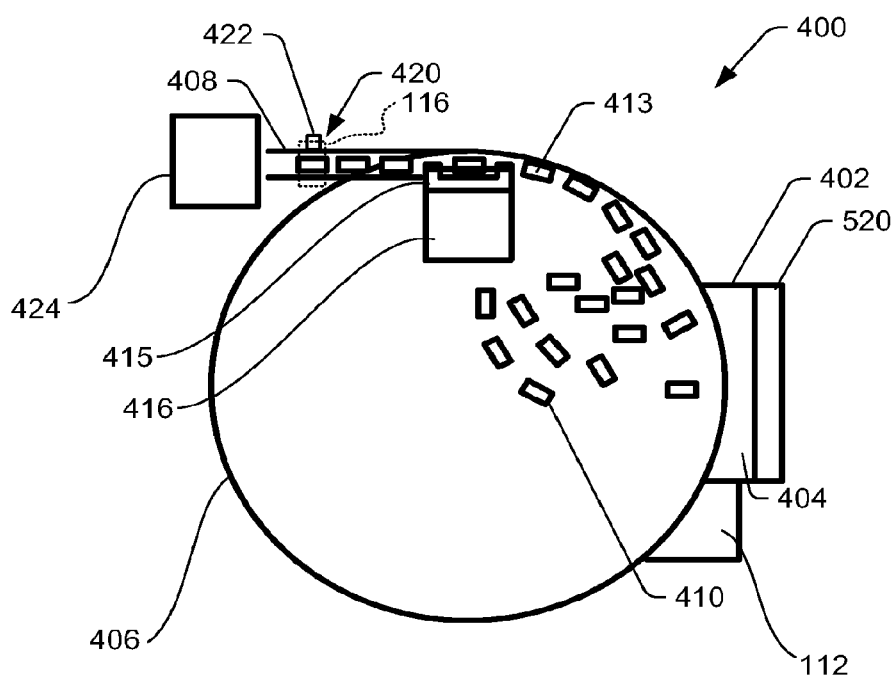
FIG. 4 is a schematic diagram of an RFID system in accordance with a third embodiment of the present invention.

Referring now to FIG. 4, therein is shown a schematic diagram of a plan view of an RFID system 400 in accordance with a third embodiment of the present invention. The RFID system 400 may be described as an automated vibratory bowl (bulk feeder) to feed RFID reader/writer/feeder. The RFID system 400 can be especially useful for RFID tags that have a self-contained antenna and packaged in a "hard plastic" body.

The RFID system 400 includes a frame 402 carrying a control system 404, shown in more detail in FIG. 5, for controlling operations and for reading and writing a "bare" RFID tag containing a transponder without an antenna as shown in FIG. 6B and described hereinafter.

A RFID vibratory bowl supply system 406 supported by the frame 402 provides a RFID tag 410 oriented by a feeder/orientation mechanism 408. In one embodiment, each RFID tag 410 may have an attached pre-printed label 413 (optional).

A RFID reader/writer 416 is mounted on the frame 402 adjacent to the feeder orientation system 408 to read and/or write the RFID tag 410.

It has been discovered as for other embodiments that it is also possible to provide the RFID tag 410 without an antenna, which makes the RFID tag 410 much less expensive and much smaller since the antenna is usually one of the more expensive parts of an RFID tag and often the largest. In such an embodiment, the reading and writing may be performed by direct contact by the RFID reader/writer 416 with contacts provided on the RFID lag 410. In another such embodiment, an antenna 415 on the RFID reader/writer 416 contacts the contacts provided on the RFID tag 410.

Where the RFID tag 410 is without an antenna, the PCB 106 of FIG. 1 will be provided with an antenna, which will connect with the contacts provided on the RFID tag 410. Antennas may be easily made on PCBs when making the electrical traces on the PCBs. The reflow soldering process used to solder components on the PCB 106 will also connect the RFID tag 410 to the antenna on the PCB 106.

The RFID tag 410 is fed to a pick-up point 420 for pick up by the PNP head 116 of the robotic handling system 108 of FIG. 1. The pick-up point 420 optionally has a non-stick surface to allow adhesive to be placed on the back of the RFID tag 410 so it may be placed on the PCB 106 to be held by a backing adhesive on the RFID tag 410.

A sensor 422 is positioned adjacent the pick-up point 420 for sensing the presence of the RFID tag 410 and its removal by the PNP head 116 of FIG. 1.

Defective RFID tags are fed to a defect bin 424.

In operation, the RFID system 400 is positioned on the feeder table 112 of the assembly line 100 of FIG. 1. The RFID system 400 may optionally be connected to the computer controlling the assembly line 100.

The RFID tag 410 is fed to a RFID reader/writer 416.

The RFID reader/writer 416 reads the RFID tag 410 to make sure that the RFID tag 410 is not defective, writing to put the correct information on the RFID tag 410, or correcting any incorrect information on the RFID tag 410. Please note that additional devices like optical sensors/scanners (not shown) may be used to read the information on the label 413 and to assure it corresponds to the information in the transponder of the RFID tag 410, if necessary.

Referring now to FIG. 5, therein is shown a schematic diagram of the internal circuit architecture 500 of a RFID system. The internal circuit architecture 500 would be in the control system 204 of FIG. 2, the control system 304 of FIG. 3, and the control system 404 of FIG. 4.

The internal circuit architecture 500 includes a microprocessor or process controller 502, which is compatible to interface with a multitude of different types of pick-and-place machines, such as those from Siemens, Universal Instruments, Panasonic, Juki, Fuji, etc.

A process controller 502 is connected to a communication port 504 to accept label content and formatting from a memory card, memory stick, the Internet, etc. The process controller 502 provides mechanisms for handshaking interface among the printer, reader, writer, and pick-and-place head of the assembly line.

The process controller 502 controls a tag supply system 506, which would be the RFID tag supply system 206 in FIG. 3, the RFID tag supply system 306 in FIG. 4, and the vibratory bowl supply system 406 in FIG. 4.

Another processor such as a content writer controller 508 is further connected to the process controller 502 to control a printer 510, such as the printer 314 of FIG. 3, and an RFID writer/writer 512, such as the RFID reader/writer 216 of FIG. 2, the RFID reader/writer 316 of FIG. 3, or the RFID reader/writer 416 of FIG. 4. The communication protocols of the content writer controller 508 adhere to existing syntax used by popular desktop labelers to minimize impact on manufacturing processes.

A label content bit memory 514 for storing label information is accessed both by the process controller 502 and the content writer controller 508.

Various sensors 516 provide information to the process controller 502 to allow it to coordinate operations of the internal circuit architecture 500, such as advancing RFID tags to the pick-up point and the condition of the tag supply system 506.

The sensors 516 allow the process controller 502 to deliver RFID tags on-demand for just-in-time operation whenever the robotic handling system removes an RFID tag.

A memory stick port 518, for flash or other type of portable memories, is connected to the process controller 502 to allow programming of the process controller 502.

An operator control panel 520 further connects to the process controller 502 to allow direct control of the process controller 502 by an operator to make adjustments during setup.

Referring now to FIG. 6A, therein is shown an RFID tag 600 with an antenna 602. The RFID tag 600 contains a transponder 604, which is an integrated circuit that can respond to radio frequency signals to read and write to a memory chip 606 that is part of or connected to the transponder 604.

The RFID tag 600 also has a label 608, which allows data to be read visually as well as electronically. In some embodiments, the RFID tag 600 is thin enough to be sandwiched within the label 608.

The RFID tag 600 also comes in different embodiments, such as passive, as shown, active, and semi-active.

Passive RFID tags have no internal power supply, such as a battery, and can have an unlimited life span. The minute electrical current induced in the antenna by the incoming radio frequency signal provides just enough power for an integrated circuit in the RFID tag to power up and transmit a response. Most passive RFID tags signal by reflecting a carrier signal from a reader. This means that the antenna has to be designed to both collect power from the incoming signal and also to reflect the signal. Passive RFID tags have practical read distances ranging from about a few inches to a few feet depending on the chosen radio frequency and antenna design/size. The RFID tag integrated circuit can contain nonvolatile memory for storing data. Lack of an onboard power supply means that the device can be quite small. The addition of the antenna creates a tag that varies from the size of a postage stamp to the size of a post card.

Semi-active RFID tags have their own internal power source which is used to power the integrated circuits that generate the outgoing signal. Active RFID tags are typically much more reliable (e.g. fewer errors) than passive RFID tags due to the ability to communicate in both directions with a RFID reader/programmer. Semi-active RFID tags typically have much longer range of hundreds of feet and larger memories than passive RFID tags so as to store additional information sent by the transceiver. Semi-active RFID tags, due to their onboard power supply, also transmit at higher power levels than passive tags, and a battery life of up to 10 years.

Active RFID tags have their own internal power source and an active radio transmitter, which provides longer ranges of thousands of feet. As more sensitive RFID reader/programmers are developed, the ranges are expected to increase.

Referring now to FIG. 6B, therein is shown an RFID tag 610 with contacts and without an antenna. The RFID tag 610 contains a transponder 614, which is an integrated circuit that can respond to radio frequency signals to read and write to a memory chip 616, which in some embodiments is part of the same integrated circuit as the transponder. The RFID tag 610 has two contacts 618 and 620. The RFID tag 610 can also be passive, semi-active, and active.

Figure 7:
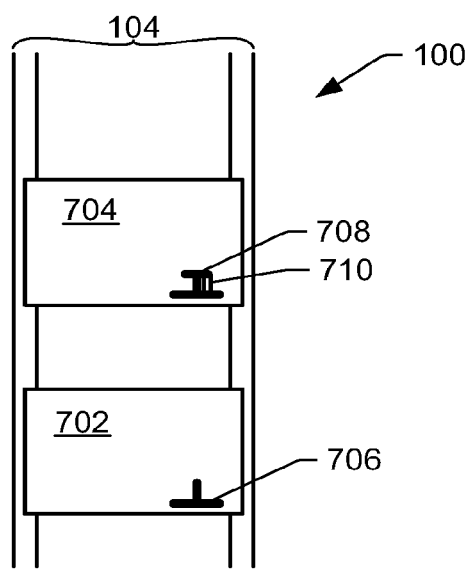
FIG. 7 is a plan view of a portion of the assembly line of FIG. 1, having a first PCB and a second PCB.

Referring now to FIG. 7, therein is shown a plan view of a portion of the assembly line 100 of FIG. 1 having a first PCB 702 and a second PCB 704. The first PCB 702 has a first type of built-in antenna 706 and the second PCB 704 has a second type of built-in antenna 708 with a RFID tag 710 connected to it.

Figure 8:
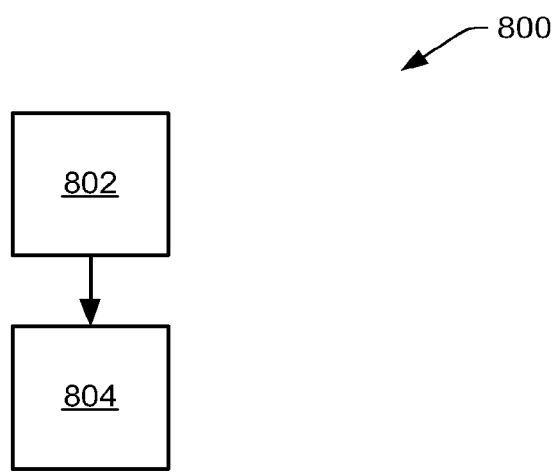
FIG. 8 is a radio frequency identification system disclosing the operation of the radio frequency identification system of FIG. 1 in an embodiment of the present invention.

Referring now to FIG. 8, therein is shown a radio frequency identification system 800 disclosing the operation of the radio frequency identification system 120 of FIG. 1 in an embodiment of the present invention. The radio frequency identification system 800 includes: supplying a radio frequency identification tag including providing a radio frequency identification transponder and writing transponder content to the radio frequency identification transponder in a block 802; and feeding the radio frequency identification tag for an assembly line in a block 804.

The term radio frequency identification system is used to describe both the system 120 and the system 800 as a matter of convenience and the determination of whether apparatus or method is being disclosed can easily be determined from context.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method comprising:
    feeding a radio frequency identification (RFID) tag to a programming location, wherein the RFID tag does not have an antenna;
    while the RFID tag is at the programming location, directly contacting the RFID tag with an RFID programmer;
    while the RFID programmer is directly contacting the RFID tag, writing to the RFID tag by the RFID programmer to form a programmed RFID tag; and
    providing the programmed RFID tag to a robotic handling system for placement on a product.

2. The method of claim 1, wherein the RFID programmer directly contacts the RFID tag with at least one contact.

3. The method of claim 2, wherein the at least one contact of the RFID programmer comprises two contacts that contact two corresponding contacts on the RFID tag.

4. The method of claim 1, wherein the RFID programmer directly contacts the RFID tag with an antenna.

5. The method of claim 1, wherein the product comprises an antenna that connects with the RFID tag.

6. The method of claim 1, wherein the programmed RFID tag is picked up by the robotic handling system at the programming location.

7. The method of claim 1, further comprising printing on a label included with the RFID tag.

8. The method of claim 1, further comprising reading the RFID tag or the programmed RFID tag with the RFID programmer.

9. The method of claim 1, wherein the RFID tag is fed along a first direction to be provided to the robotic handling system, wherein the product is moving along an assembly line in a second direction substantially perpendicular to the first direction.

10. The method of claim 1, wherein the robotic handling system comprises a pick-and-place robot.

11. A system comprising:
    a feeder configured to feed a radio frequency identification (RFID) tag to a programming location, wherein the RFID tag does not have an antenna;
    an RFID programmer configured to:
        directly contact the RFID tag while the RFID tag is at the programming location; and
        while the RFID programmer is directly contacting the RFID tag, write to the RFID tag by the RFID programmer to form a programmed RFID tag; and
    wherein the system is further configured to provide the programmed RFID tag to a robotic handling system for placement on a product.

12. The system of claim 11, wherein the RFID programmer is further configured to directly contact the RFID tag with at least one contact.

13. The system of claim 12, wherein the at least one contact of the RFID programmer comprises two contacts that are configured to contact two corresponding contacts on the RFID tag.

14. The system of claim 11, wherein the RFID programmer is configured to directly contact the RFID tag with an antenna.

15. The system of claim 11, wherein the product comprises an antenna that connects with the RFID tag.

16. The system of claim 11, wherein the system is further configured such that the robotic handling system picks up the programmed RFID tag at the programming location.

17. The system of claim 11, further comprising a printer configured to print on a label included with the RFID tag.

18. The system of claim 11, wherein the RFID programmer is further configured to read the RFID tag or the programmed RFID tag.

19. The system of claim 11, wherein the system is arranged such that the RFID tag is fed along a first direction to be provided to the robotic handling system, wherein the product is moving along an assembly line in a second direction substantially perpendicular to the first direction.

20. The system of claim 11, wherein the robotic handling system comprises a pick-and-place robot.

* * * * *